US011689199B2

(12) United States Patent
Chen et al.

(10) Patent No.: US 11,689,199 B2
(45) Date of Patent: Jun. 27, 2023

(54) ANALOGUE SWITCH ARRANGEMENT

(71) Applicant: NXP USA, Inc., Austin, TX (US)

(72) Inventors: Jianluo Chen, Suuzhou (CN);
Jianzhou Wu, Suzhou (CN); Yikun Mo, Suzhou (CN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/807,902

(22) Filed: Jun. 21, 2022

(65) Prior Publication Data
US 2022/0416779 A1 Dec. 29, 2022

(30) Foreign Application Priority Data
Jun. 23, 2021 (CN) .......................... 202110701289.X

(51) Int. Cl.
*H03K 17/16* (2006.01)
*H03K 17/687* (2006.01)
*H03K 17/00* (2006.01)

(52) U.S. Cl.
CPC ......... *H03K 17/162* (2013.01); *H03K 17/002* (2013.01); *H03K 17/6872* (2013.01)

(58) Field of Classification Search
CPC .... H03K 17/002; H03K 17/005; H03K 17/04; H03K 17/041; H03K 17/04106; H03K 17/06; H03K 17/063; H03K 17/16; H03K 17/161; H03K 17/162; H03K 17/163; H03K 17/164; H03K 17/687; H03K 17/6871; H03K 17/6872; H03K 17/6874; H03K 2217/0018; H03K 2217/0054
See application file for complete search history.

(56) References Cited

U.S. PATENT DOCUMENTS

| 7,728,649 | B1 | 6/2010 | Webb et al. |
| 10,236,873 | B2 | 3/2019 | Cical et al. |
| 11,146,226 | B2 * | 10/2021 | Sakai ............... H03K 17/08122 |
| 2020/0412317 | A1 * | 12/2020 | Sakai ............... H03K 17/08122 |

* cited by examiner

Primary Examiner — Long Nguyen

(57) ABSTRACT

An analogue switch arrangement includes an analogue switch including a first and second transistor in parallel between an input terminal and an output terminal and an input transistor arrangement including a first control transistor, a second control transistor, a first voltage control transistor and a second voltage control transistor. The gate terminals of both the first and second transistors are configured to receive a first and second control signal for controlling the analogue switch between an on-state and an off-state. The gate terminals of both the first and second voltage control transistors are configured to receive a voltage based on the voltage at the output terminal to provide for control of the voltage applied at the input terminal based on the voltage at the output terminal when the analogue switch is in the off-state.

18 Claims, 2 Drawing Sheets

ANALOGUE SWITCH ARRANGEMENT

CROSS-REFERENCE TO RELATED APPLICATIONS

This application claims the priority under 35 U.S.C. § 119 of China application no. 202110701289.X, filed on 23 Jun. 2021, the contents of which are incorporated by reference herein.

FIELD

The present disclosure relates to an analogue switch arrangement comprising an analogue switch and an input transistor arrangement.

BACKGROUND

A multiplexer typically includes a plurality of switches, which may comprise analogue switches. An analogue comparator may include a plurality of multiplexers and therefore a plurality of analogue switches.

SUMMARY

According to a first aspect of the present disclosure there is provided an analogue switch arrangement comprising:
  an analogue switch comprising a first transistor in parallel with a second transistor between an input terminal and an output terminal, wherein a gate terminal of the first transistor is configured to receive a second control signal and wherein a gate terminal of the second transistor is configured to receive a first control signal, wherein the first control signal and the second control signal provide for control of the analogue switch between an on-state and an off-state;
  an input transistor arrangement comprising a chain comprising a first control transistor having a first terminal coupled to a supply voltage terminal configured to receive a supply voltage and a second terminal coupled to a first terminal of a first voltage control transistor, a second terminal of the first voltage control transistor is coupled to a first terminal of a second voltage control transistor, a second terminal of the second voltage control transistor is coupled to a first terminal of a second control transistor and a second terminal of the second control transistor is coupled to a ground terminal configured to be coupled to a reference voltage;
  wherein the input terminal is coupled to the second terminal of the first voltage control transistor and the first terminal of the second voltage control transistor; and
  a gate of the first control transistor is configured to receive the second control signal, and a gate of the second control transistor is configured to receive the first control signal, wherein the first and second control transistors are configured to couple the first and second voltage control transistors to the supply voltage terminal and the ground terminal when the analogue switch is in the off-state; and
  gate terminals of both the first and second voltage control transistors are configured to receive a voltage based on the voltage at the output terminal, and wherein the first and second voltage control transistors are configured to provide for control of the voltage applied at the input terminal based on the voltage at the output terminal when the analogue switch is in the off-state.

In one or more examples, one or more of the first transistor, the second transistor, first control transistor, the second control transistor, the first voltage control transistor and the second voltage control transistor are MOSFETs.

In one or more embodiments, the first transistor is an NMOS transistor and the second transistor is a PMOS transistor.

In one or more embodiments, the first and second control transistors are configured to decouple the first and second voltage control transistors from the supply voltage terminal and the ground terminal when the analogue switch is in the on-state.

In one or more embodiments, the body of the first control transistor is coupled to the supply voltage terminal and the body of the second control transistor is coupled to the ground terminal.

In one or more embodiments, the body of the first control transistor is configured to be coupled to a first reference voltage, and the body of the second control transistor is configured to be coupled to a second reference voltage, wherein the first reference voltage is greater than the second reference voltage, and wherein
  the body of the first voltage control transistor is configured to be coupled to a third reference voltage, wherein the third reference voltage is the voltage of the substrate in which the analogue switch and input transistor arrangement are formed, and the body of the second voltage control transistor is configured to be coupled to a fourth reference voltage, wherein the fourth reference voltage is based on the voltage at the input terminal.

In one or more embodiments, the analogue switch arrangement is configured to operate in at least two modes comprising a first mode and a second mode wherein:
  in the first mode the analogue switch is in the on-state and conductive to couple the input terminal and the output terminal and wherein the first control transistor and the second control transistor are non-conductive and the voltage at the input terminal is not controlled by the input transistor arrangement; and
  in the second mode the analogue switch is in the off-state and non-conductive and wherein the first control transistor and the second control transistor are conductive and the voltage at the input terminal is controlled by the voltage at the output terminal by way of the first voltage control transistor and the second voltage control transistor.

In one or more embodiments, a source terminal of the second transistor is coupled to the input terminal and a drain terminal of the second transistor is coupled to the output terminal, and a body of the second transistor is configured to be coupled to the source terminal of the second transistor; and
  wherein a source terminal of the first transistor is coupled to the input terminal and a drain terminal of the first transistor is coupled to the output terminal, and a body of the first transistor is configured to be coupled to receive the reference voltage at the ground terminal.

In one or more embodiments, a body of one of the first and second voltage control transistors is configured to be coupled to a substrate in which the analogue switch and input transistor arrangement are formed and a body of the other of the first and second voltage control transistors is configured to be coupled to receive a first voltage.

In one or more embodiments, the first voltage comprises the voltage at the input terminal.

In one or more embodiments, the first control signal and second control signal are complementary signals. In one or more embodiments, the first and second control signals are digital control signals.

In one or more embodiments, the first control transistor is a PMOS transistor and wherein the second control transistor is an NMOS transistor. In one or more embodiments, first voltage control transistor is an NMOS transistor and wherein the second voltage control transistor is a PMOS transistor.

According to a second aspect of the present disclosure there is provided an apparatus comprising a substrate comprising the analogue switch arrangement of any preceding claim and at least one further analogue switch, wherein the at least one further analogue switch is formed on the same substrate as the analogue switch arrangement.

In one or more embodiments, the apparatus further comprises a digital to analog converter, DAC, and a comparator, wherein
the output of the DAC is configured to be coupled to an input terminal of the at least one further analogue switch, and wherein
the output terminals of the analogue switch arrangement and the at least one further analogue switch are coupled to an input terminal of the comparator.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

An analogue switch typically comprises a pair of transistors and provides an effective switching element. Analogue switches may form part of multiplexers. Analogue switches may form part of analogue comparators. In some examples, when an analogue multiplexer or analogue switch is in an off-state, i.e. when the analogue switch is disabled, it is possible for gate induced drain leakage (GIDL) to occur, which can affect operation. The GIDL may be dependent on the output voltage of the analogue switch or multiplexer and can affect the integral-non-linearity (INL) of digital to analog converters (DAC) to which they may be coupled. When analogue switches are part of multiplexers, GIDL may cause current leakage between adjacent multiplexers, also resulting in disadvantageous behaviour.

The example embodiments disclosed herein provide an analogue switch arrangement that includes an analogue switch together with an input transistor arrangement. The analogue switch arrangement is configured to control the voltage applied at the input terminal of the analogue switch based on the voltage at the output terminal of the analogue switch by the action of the input transistor arrangement. In one or more examples, analogue switches having the input transistor arrangement may have reduced GIDL.

In one or more examples, a voltage difference between the input terminal and output terminal of the analogue switch can be reduced, at least when the analogue switch is disabled. Typically, when the analogue switch is disabled, no input signal is provided to the input terminal. In one or more examples, the input transistor arrangement is configured to reduce the voltage difference between the input terminal and output terminal of the analogue switch, such as to below a threshold level, by applying a voltage at the input terminal that is based on the voltage at the output terminal. Accordingly, if a high voltage is present at the output terminal, the input transistor arrangement may be configured to apply a high voltage at the input terminal to reduce the voltage difference. Likewise, if a low voltage is present at the output terminal, the input transistor arrangement may be configured to apply a low voltage at the input terminal to reduce the voltage difference. In one or more examples, the voltage applied at the input terminal may be configured to match the voltage detected at the output terminal within a threshold. In one or more examples, the input transistor arrangement is configured to receive a supply voltage and, if a voltage above a threshold level is detected at the output terminal of the analogue switch, the input transistor arrangement is configured to apply said supply voltage to the input terminal of the analogue switch when the analogue switch is in the off-state (i.e. when the analogue switch is switched off).

Figure 1:
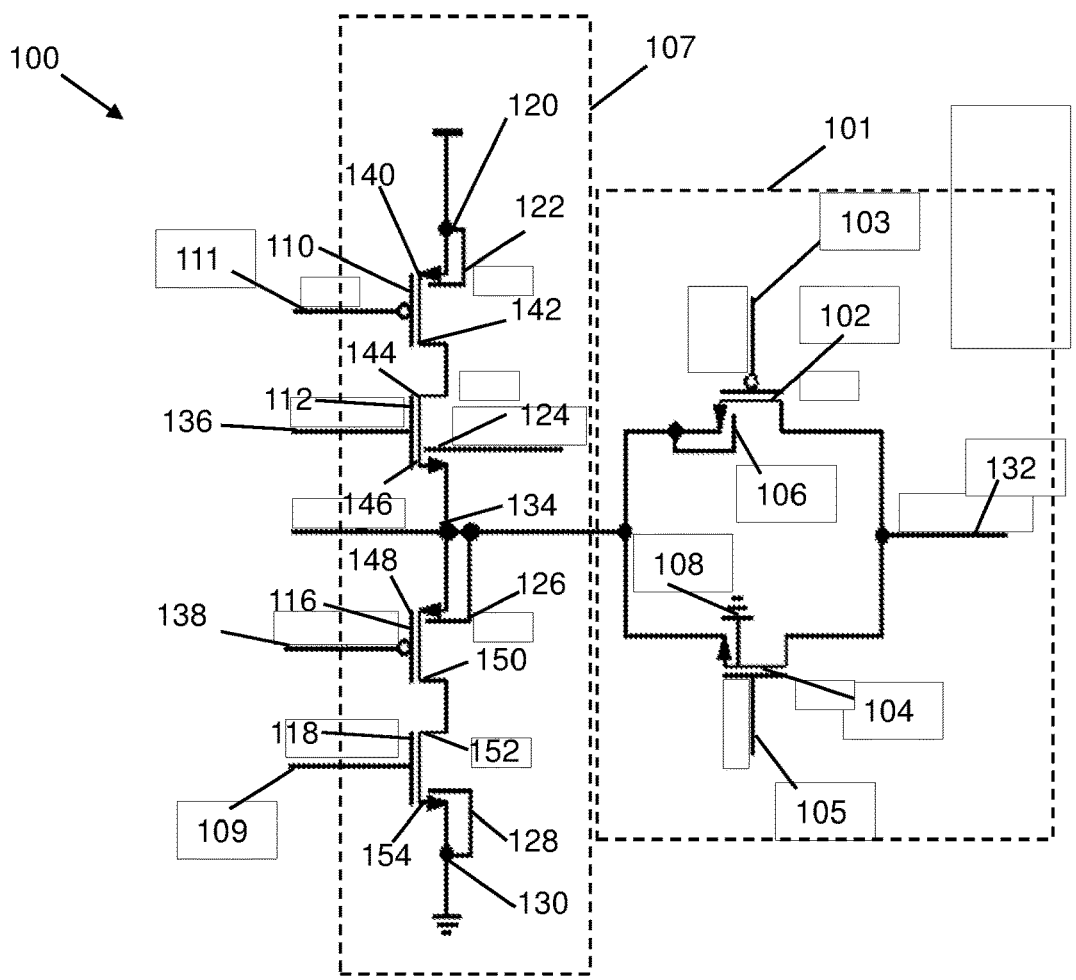
FIG. 1 shows an example embodiment of the analogue switch arrangement comprising an analog switch and an input transistor arrangement.

Example FIG. 1 shows an example of an analogue switch arrangement 100 comprising an analog switch 101 and an input transistor arrangement 107.

The analogue switch 101 comprises a first transistor 104 in parallel with a second transistor 102 between an input terminal 134 and an output terminal 132.

In this example, the source terminal of the second transistor 102 is coupled to the input terminal 134 and a drain terminal of the second transistor 102 is coupled to the output terminal 132. A gate terminal 103 of the second transistor 102 is configured to receive a first control signal and a body 106 of the second transistor may be configured to be coupled to the source terminal of the second transistor. The input terminal 134 and output terminal 132 may be coupled to the input and output terminal respectively of a multiplexer.

A source terminal of the first transistor 104 is coupled to the input terminal 134 and a drain terminal of the first transistor is coupled to the output terminal 132. The gate terminal 105 of the first transistor is configured to receive a second control signal, and a body of the first transistor is configured to be coupled to a reference voltage terminal 108, which is for coupling to ground or other reference voltage. In one or more examples, the first transistor 104 and the second transistor 102 together provide the function of a switch in that they have an on-state and an off-state.

The input transistor arrangement 107 comprises a series connected chain of transistors between a supply voltage terminal 120 and a ground terminal 130. The chain comprises a first control transistor 110 having a first terminal 140 configured to be coupled to the supply voltage terminal 120. The supply voltage terminal is configured to receive a supply voltage. The first control transistor 110 comprises a second terminal 142 coupled to a first terminal 144 of a first voltage control transistor 112. A second terminal 146 of the first voltage control transistor is coupled to a first terminal 148 of a second voltage control transistor 116. A second terminal 150 of the second voltage control transistor is coupled to a first terminal 152 of a second control transistor 118. A second terminal 154 of the second control transistor is coupled to a ground terminal 130. The ground terminal 130 is configured to be coupled to the reference voltage.

The input terminal 134 is coupled to the second terminal 146 of the first voltage control transistor 112 and the first terminal 148 of the second voltage control transistor 116. Thus, the input terminal 134 is positioned between the first and second voltage control transistors 112, 116.

A body 124, 126 of one of the first and second voltage control transistors 112 and 116 is configured to be coupled to a substrate in which the analogue switch 101 and input transistor arrangement 107 are formed and a body terminal 124, 126 of the other of the first and second voltage control transistors 116 and 112 is configured to be coupled to receive a first voltage, which is shown in example FIG. 1 as comprising the voltage at the input terminal 132. The gate terminals 136, 138 of both the first and second voltage control transistors 112 and 116 are configured to receive a voltage based on the voltage at the output terminal 132. In one or more examples, said voltage may be the voltage at the output terminal 132.

A gate terminal 111 of the first control transistor 110 is configured to receive the second control signal and a gate terminal 109 of the second control transistor 118 is configured to receive the first control signal. Thus, in this way, the gate terminal 111 of the first control transistor 110 and the gate terminal 105 of the first transistor 104 are both controlled by the second control signal. Similarly, the gate terminal 109 of the second control transistor 118 and the gate terminal 103 of the second transistor 102 are both controlled by the first control signal. This arrangement may be configured to provide for connection of the first and second voltage control transistors 112 and 116 to the supply voltage terminal 120 and the ground terminal 130 only when the analogue switch is in the off-state. Further, the first and second voltage control transistors 112 and 116 are configured to couple the input terminal 134 to the supply voltage terminal 120 if the voltage at the output terminal 132 (effectively received at their gate terminals) is high and couple the input terminal to the ground terminal 130 if the voltage is low.

Thereby, when in use, a voltage at the output terminal 132 is configured to control the voltage applied at the input terminal 134 via the input transistor arrangement 107, particularly when the switch 101 is in the off-state.

The input transistor arrangement 107 may be configured to control the voltage difference across the analogue switch input 134 and output 132 terminals such that the voltage difference is low (such as below a threshold voltage), particularly when the analogue switch is in the off-state (i.e. non-conductive).

The first control transistor 110 and the second control transistor 118 are configured to connect the first and second voltage control transistors 116 and 112 to the supply voltage when the analogue switch 101 is in the off-state. The first control transistor 110 and the second control transistor 118 are configured to disconnect the first and second voltage control transistors 116 and 112 from the supply voltage terminal 120 when the analogue switch 101 is in the on-state.

The first and second voltage control transistors 112 and 116 are configured, when connected between the supply voltage and ground, to apply a voltage at the input terminal 134 based on the voltage at the output terminal 132, which, as mentioned above, may be applied at their gate terminals.

The first transistor 104 and second transistor 102 may comprise MOSFETs, such as one p-type MOSFET and one n-type MOSFET. However, in other examples, the analogue switch 101 may comprise other transistor types, such as other types of FET.

In this and other examples, the first transistor 104 may be an NMOS transistor and the second transistor 102 may be a PMOS transistor.

In this example, the first control signal and the second control signal are complementary. Thus, when one is high, the other is low and vice versa. In other examples, the first control signal and the second control signal may be the same control signal and one of the gate terminals 103, 105 may include a logic inverter or logic NOT to invert the common first/second control signal.

In this example, the first control transistor 110, the second control transistor 118, the first voltage control transistor 112 and the second voltage control transistor 116 are MOSFETs. However, other transistor types may be used to control the voltage at the input terminal 134, such as other types of FET. Accordingly, the first and second control transistors 110, 118 may comprise any transistor pair arrangement configured to couple the first and second voltage control transistors 112, 116 to the supply voltage terminal 120 and the ground terminal 130 respectively when the analogue switch is off. Further, the first and second voltage control transistors 112, 116 may comprise any transistor pair arrangement configured to selectively apply the supply voltage to the input terminal 134 based on the voltage at the output terminal 132.

The first voltage received at the body 126 of the second voltage control transistors 116 may comprise the voltage at the input terminal 132. Thus, FIG. 1 shows the body terminal 126 coupled to the input terminal 134. It will be appreciated that the body 126 of the second voltage control transistors 116 may be configured to receive a voltage based on the voltage applied at the input terminal 134. For example, circuitry may be provided such that the voltage may be low when the voltage at the input terminal 134 is low or below a threshold and high when the voltage at the input terminal 134 is high or higher than a threshold.

The body 122 of the first control transistor 110 may be coupled to the supply voltage terminal 120 for receiving the supply voltage. The body 128 of the second control transistor 118 may be coupled to the ground terminal 130 for receiving the reference voltage.

Figure 3:
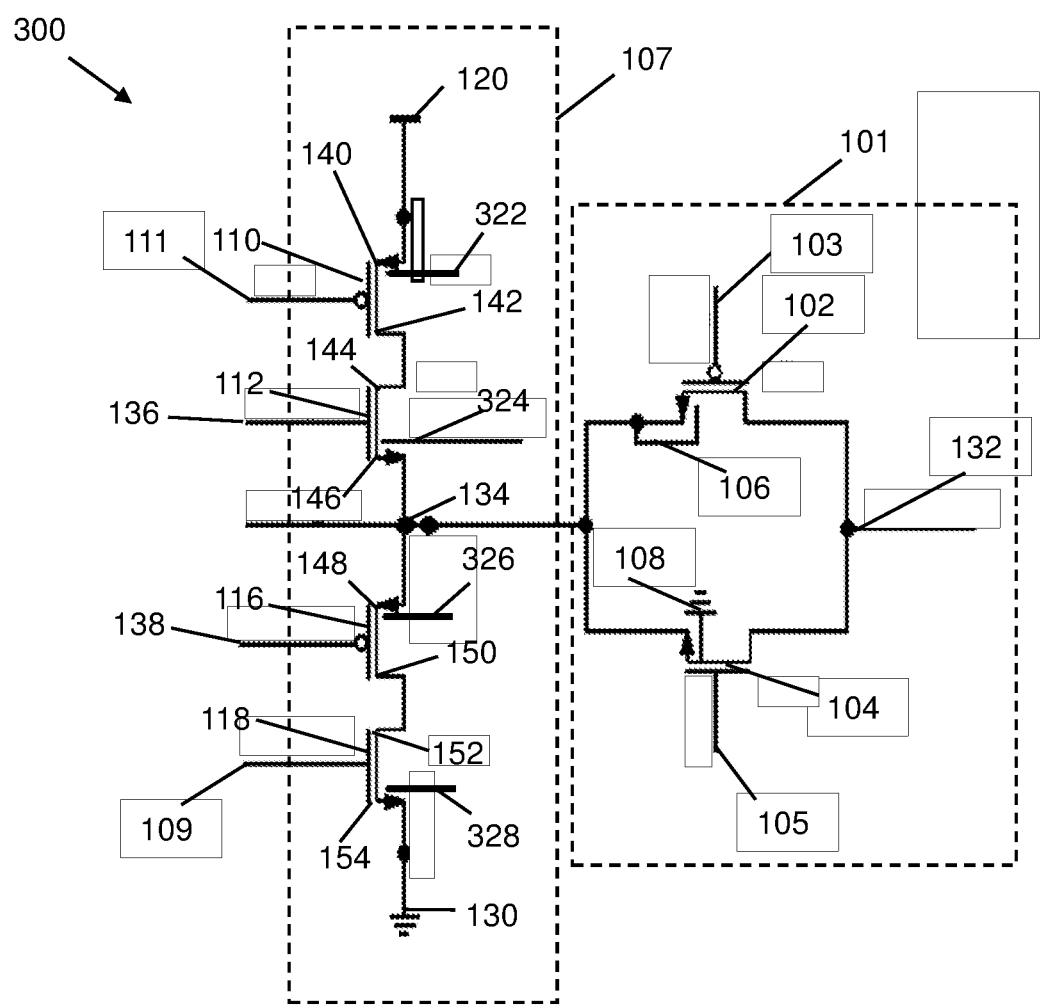
FIG. 3 shows a second example embodiment of the analogue switch arrangement in which the input transistor arrangement has the body of the transistors coupled to different reference voltages.

More generally and with reference to FIG. 3, the body 122 of the first control transistor 110 may be coupled to receive a first reference voltage 322. The body of the second control transistor 118 may be configured to be coupled to receive a second reference voltage 328. In one or more examples the first reference voltage 322 is greater than the second reference voltage 328. In other examples the first reference may be lower than the second reference voltage.

The body of the first voltage control transistor 112 may be configured to be coupled to receive a third reference voltage 324 and the body of the second voltage control transistor 116 may be configured to be coupled to receive a fourth reference voltage 326.

In one or more embodiments the analogue switch arrangement 100 may be configured to operate in at least two modes comprising a first mode and a second mode.

In the first mode, the analogue switch 101 is in an on-state and the analogue switch is conductive and configured to couple the input terminal 134 and the output terminal 132. Furthermore, in the first mode, the first control transistor 110 and the second control transistor 118 are non-conductive. In the second mode, the analogue switch is in an off-state and the analogue switch is non-conductive. In the second mode, the input terminal 134 and the output terminal 132 are effectively disconnected by the analogue switch 101. In the second mode, the first control transistor 110 and the second control transistor 118 are conductive and the voltage at the input terminal 134 is controlled by the voltage at the output terminal 132 by the action of the first voltage control transistor 112 and the second voltage control transistor 116.

The two modes of operation are controlled by the first and second control signals applied at gate terminals 103, 105 of the analogue switch 101 and the gate terminals 111, 109 of the first and second control transistors 110, 118. In one or more examples, the control signals are digital control signals which have a digital high (1) or a digital low (0) value. For brevity, the first control signal will be referred to as "en_b" and second control signal will be referred to as "en".

In the first mode of operation the second control signal is set to a high level, i.e. en=1 and the first control signal is set to a logic low i.e. en_b=0. During the first mode of operation, the first transistor 104 and second transistor 102 are turned on (i.e. the analog switch is conductive as is mentioned above). At the same time the first control transistor 110 and the second control transistor 118 are turned off (i.e. non-conductive). In this configuration the circuit of FIG. 1 will operate as a conventional analogue switch, which may comprise an analogue switch of a multiplexer circuit and the input transistor arrangement 107 is inactive.

In the second mode of operation, the second control signal is set to a low level, i.e. en=0 and the first control signal is set to a logic high i.e. en_b=1. During the second mode of operation, the first transistor 104 and second transistor 102 are turned off (i.e. the analogue switch 101 is non-conductive as mentioned above). At the same time, the first control transistor 110 and the second control transistor 118 are turned on (i.e. conductive). In this configuration the first voltage control transistor 112 and the second voltage control transistor 116 are controlled by the voltage at the output terminal 132 which is coupled to the gate terminals 136, 138 of the first voltage control transistor 112 and the second voltage control transistor 116.

If the voltage at the output terminal 132 is high, the voltage applied to the gate terminals 136, 138 of the first voltage control transistor 112 and the second voltage control transistor 116 is configured to be such that only the first voltage control transistor 112 is conductive. In this case the input terminal 134 is coupled to the supply voltage terminal 120 and thereby to the supply voltage.

In one or more embodiments, the input transistor arrangement 107 is configured to apply the supply voltage to the input terminal 134 when the voltage at the output terminal exceeds a threshold, which may be defined by the turn-on voltage or turn-off voltage of the gate terminal 136, 138 of the first voltage control transistor 112 and the second voltage control transistor 116.

In one or more embodiments the voltage applied to the gate terminals 136, 138 may be based on the voltage at the output terminal 132 and may be provided via additional components (not shown) between the output terminal 132 and the gate terminals 136, 138.

If the voltage at the output terminal 132 is low, the voltage applied to the gate terminals 136, 138 of the first voltage control transistor 112 and the second voltage control transistor 116 can be configured such that only the second voltage control transistor 116 is conductive. In this case, the input terminal 134 is coupled to the ground terminal 130 and thereby to the reference voltage.

In one or more embodiments the analogue switch arrangement 100 may be configured such that the first control transistor 110 is a PMOS transistor. In one or more embodiments the analogue switch arrangement 100 may be configured such that the second control transistor 118 is an NMOS transistor.

In one or more embodiments the analogue switch arrangement 100 may be configured such that the first voltage control transistor 112 is an NMOS transistor.

In one or more embodiments the analogue switch arrangement 100 may be configured such that the second voltage control transistor 116 is a PMOS transistor.

It will be seen that each pair of voltage control transistors or control transistors is formed of a complementary pair of transistors, such that one is a P-type and the other is an N-type.

In one or more embodiments the analogue switch arrangement 100 may be configured such that the first and second control signals applied to the gate terminals 103, 105 of the first and second transistors 102, 104 are digital control signals.

From the foregoing description the operation of the input transistor arrangement 107 is configured such that if the output of the analogue switch 132 is low, the input terminal 134 will be coupled to the reference voltage at the ground terminal 130. If, however, the output 132 of the analogue switch is high, the input terminal 134 will be coupled to the supply voltage by the supply voltage terminal 120.

Figure 2:
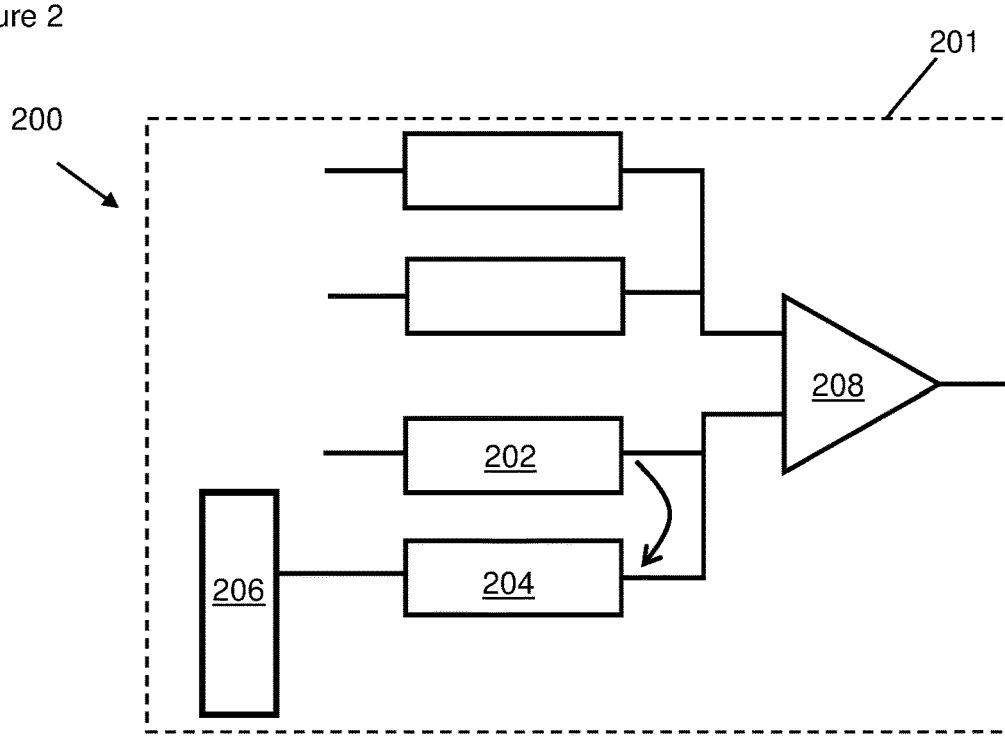
FIG. 2 shows an example apparatus comprising the analogue switch arrangement.

FIG. 2 shows the analogue switch arrangement 100, 202 implemented as part of an apparatus 200 such as a multiplexer. The apparatus 200 has a further analogue switch 204 coupled between the output terminal of a DAC 206 and a terminal of a comparator 208.

In one or more embodiments, the output of the DAC 206 is configured to be coupled to an input terminal of the at least one further analogue switch 204.

The further analogue switch 204 may be of the form of the analogue switch 101. The output terminal of the at least one further analogue switch 204 and the output terminal 132 of the analogue switch 101 of the analogue switch arrangement 100 are configured to be coupled to a terminal of the comparator 208.

The apparatus 200 comprises a substrate 201 in which the analogue switch 101 and input transistor arrangement 107 of the analogue switch arrangement 100, 202 are formed.

For the embodiment shown in FIG. 2, the voltage detected at the output terminal 132 of the analogue switch 101 may be related to or otherwise based on the voltage being provided by the DAC 206 to a terminal of the comparator 208 through the further analogue switch 204. In some examples the DAC may be connected to an input terminal of the comparator. In some examples the comparator 208 may be an analogue comparator.

By controlling the voltage at the input terminal 134 based on the voltage at the output terminal 132, the voltage difference across the analogue switch arrangement 100, 202 can be reduced. This results in reducing the GIDL current and consequently a smaller impact on the INL of the DAC 206 should the arrangement 100, 202 form part of a comparator circuit with the input terminal 134 configured to receive a voltage based on the output from the DAC 208 (which has been described in relation to FIG. 2).

The foregoing approach may ensure that when the analogue switch 101 is non conducting and the analogue switch 204 is conducting, the GIDL current from the analogue switch arrangement 100, 202 may be reduced because the input transistor arrangement 107 is configured to reduce the potential difference across the analogue switch 101 of the arrangement 202.

In one or more examples, the DAC is an 8-Bit DAC, however higher or lower resolution DACs can also be used.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An analogue switch arrangement comprising:
an analogue switch comprising a first transistor in parallel with a second transistor between an input terminal and an output terminal, wherein a gate terminal of the first transistor is configured to receive a second control signal and wherein a gate terminal of the second transistor is configured to receive a first control signal, wherein the first control signal and the second control signal provide for control of the analogue switch between an on-state and an off-state;
an input transistor arrangement comprising a chain comprising a first control transistor having a first terminal coupled to a supply voltage terminal configured to receive a supply voltage and a second terminal coupled to a first terminal of a first voltage control transistor, a second terminal of the first voltage control transistor is coupled to a first terminal of a second voltage control transistor, a second terminal of the second voltage control transistor is coupled to a first terminal of a second control transistor and a second terminal of the second control transistor is coupled to a ground terminal configured to be coupled to a reference voltage;
wherein the input terminal is coupled to the second terminal of the first voltage control transistor and the first terminal of the second voltage control transistor; and
a gate of the first control transistor is configured to receive the second control signal, and a gate of the second control transistor is configured to receive the first control signal, wherein the first and second control transistors are configured to couple the first and second voltage control transistors to the supply voltage terminal and the ground terminal when the analogue switch is in the off-state; and
gate terminals of both the first and second voltage control transistors are configured to receive a voltage based on the voltage at the output terminal, and wherein the first and second voltage control transistors are configured to provide for control of the voltage applied at the input terminal based on the voltage at the output terminal when the analogue switch is in the off-state.

2. The analogue switch arrangement of claim 1, wherein the first transistor is an NMOS transistor and the second transistor is a PMOS transistor.

3. The analogue switch arrangement of claim 1, wherein the first and second control transistors are configured to decouple the first and second voltage control transistors from the supply voltage terminal and the ground terminal when the analogue switch is in the on-state.

4. The analogue switch arrangement of claim 1, wherein the body of the first control transistor is coupled to the supply voltage terminal and the body of the second control transistor is coupled to the ground terminal.

5. The analogue switch arrangement of claim 1, wherein the body of the first control transistor is configured to be coupled to a first reference voltage, and the body of the second control transistor is configured to be coupled to a second reference voltage, wherein the first reference voltage is greater than the second reference voltage, and wherein
the body of the first voltage control transistor is configured to be coupled to a third reference voltage, wherein the third reference voltage is the voltage of the substrate in which the analogue switch and input transistor arrangement are formed, and the body of the second voltage control transistor is configured to be coupled to a fourth reference voltage, wherein the fourth reference voltage is based on the voltage at the input terminal.

6. The analogue switch arrangement of claim 1, wherein the analogue switch arrangement is configured to operate in at least two modes comprising a first mode and a second mode wherein:
in the first mode the analogue switch is in the on-state and conductive to couple the input terminal and the output terminal and wherein the first control transistor and the second control transistor are non-conductive and the voltage at the input terminal is not controlled by the input transistor arrangement; and
in the second mode the analogue switch is in the off-state and non-conductive and wherein the first control transistor and the second control transistor are conductive and the voltage at the input terminal is controlled by the voltage at the output terminal by way of the first voltage control transistor and the second voltage control transistor.

7. The analogue switch arrangement of claim 1, wherein a source terminal of the second transistor is coupled to the input terminal and a drain terminal of the second transistor is coupled to the output terminal, and a body of the second transistor is configured to be coupled to the source terminal of the second transistor; and
wherein a source terminal of the first transistor is coupled to the input terminal and a drain terminal of the first transistor is coupled to the output terminal, and a body of the first transistor is configured to be coupled to the ground terminal to receive the reference voltage.

8. The analogue switch arrangement of claim 1, wherein a body of one of the first and second voltage control transistors is configured to be coupled to a substrate in which the analogue switch and input transistor arrangement are formed and a body of the other of the first and second voltage control transistors is configured to be coupled to receive a first voltage.

9. The analogue switch arrangement of claim 8, wherein the first voltage comprises the voltage at the input terminal.

10. The analogue switch arrangement of claim 1, wherein the first control signal and second control signal are complementary signals.

11. The analogue switch arrangement of claim 1, wherein the first control transistor is a PMOS transistor and wherein the second control transistor is an NMOS transistor.

12. The analogue switch arrangement of claim 1, wherein the first voltage control transistor is an NMOS transistor and wherein the second voltage control transistor is a PMOS transistor.

13. The analogue switch arrangement of claim 1, wherein the first and second control signals are digital control signals.

14. An apparatus comprising a substrate comprising the analogue switch arrangement of claim 1 and at least one further analogue switch, wherein the at least one further analogue switch is formed on the same substrate as the analogue switch arrangement.

15. The apparatus of claim 14 further comprising a digital to analog converter, DAC, and a comparator, wherein the output of the DAC is configured to be coupled to an input terminal of the at least one further analogue switch, and wherein the output terminals of the analogue switch arrangement and the at least one further analogue switch are coupled to an input terminal of the comparator.

16. The analogue switch arrangement of claim 1, wherein one or more of the first transistor, the second transistor, first control transistor, the second control transistor, the first voltage control transistor and the second voltage control transistor are field effect transistors.

17. The analogue switch arrangement of claim 1, wherein the first transistor and the second transistor are MOSFETs.

18. The analogue switch arrangement of claim 1, wherein the first control transistor and the second control transistor are MOSFETs.

* * * * *